US008648420B2

United States Patent
Kim et al.

(10) Patent No.: US 8,648,420 B2
(45) Date of Patent: Feb. 11, 2014

(54) SEMICONDUCTOR DEVICE

(75) Inventors: Young-Chul Kim, Chungcheongbuk-do (KR); Il-Kwon Chang, Chungcheongbuk-do (KR); Ji-Ho Lew, Chungcheongbuk-do (KR); Kyoung-Sik Kim, Chungcheongbuk-do (KR); So-Youn Kim, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 366 days.

(21) Appl. No.: 12/849,737

(22) Filed: Aug. 3, 2010

(65) Prior Publication Data

US 2011/0169091 A1    Jul. 14, 2011

(30) Foreign Application Priority Data

Jan. 11, 2010    (KR) .................. 10-2010-0002161

(51) Int. Cl.
    *H01L 23/62*    (2006.01)
(52) U.S. Cl.
    USPC .................. 257/355; 257/360; 257/E29.255
(58) Field of Classification Search
    USPC .................. 257/355, 360, E29.255; 361/56
    See application file for complete search history.

(56) References Cited

U.S. PATENT DOCUMENTS

| 7,541,648 | B2 * | 6/2009  | Jin ............................. 257/361 |
| 7,679,872 | B2 * | 3/2010  | Kawa et al. ................. 361/56 |
| 7,782,583 | B2   | 8/2010  | Moon |
| 2002/0017690 | A1 | 2/2002 | Hayashida |
| 2003/0223166 | A1 * | 12/2003 | Chen et al. ............... 361/56 |
| 2007/0177317 | A1 * | 8/2007 | Kim ........................... 361/56 |
| 2008/0259512 | A1 | 10/2008 | Moon |
| 2009/0101937 | A1 * | 4/2009 | Lee et al. ................. 257/137 |
| 2009/0140339 | A1 | 6/2009 | Kim |

FOREIGN PATENT DOCUMENTS

| KR | 10-1990-0007917 | 10/1990 |
| KR | 10-0849069 | 7/2008 |
| KR | 10-2009-0056199 | 6/2009 |

* cited by examiner

*Primary Examiner* — Tuan N. Quach
(74) *Attorney, Agent, or Firm* — Blakely Sokoloff Taylor & Zafman

(57) ABSTRACT

A semiconductor device includes an input/output pad, and a data transfer unit configured to form a parasitic diode between the input/output pad and a power supply terminal thereof to discharge an introduced electrostatic discharge (ESD), and form a data transfer path between the input/output pad and an internal circuit in response to a control signal.

24 Claims, 4 Drawing Sheets

SEMICONDUCTOR DEVICE

CROSS-REFERENCES TO RELATED APPLICATIONS

The present application claims priority of Korean Patent Application No. 10-2010-002161, filed on Jan. 11, 2010, which is incorporated herein by reference in its entirety.

BACKGROUND OF THE INVENTION

Exemplary embodiments of the present invention relate to a semiconductor design technology, and more particularly, to an electrostatic discharge (ESD) circuit for protecting an internal circuit from ESD introduced thereinto.

In general, an ESD circuit is provided inside a semiconductor device, including a display driver IC (DDI), in order to protect an internal circuit from ESD. The ESD refers to a phenomenon that accumulated charges move between objects having different potentials at a high speed for several hundred pico seconds (ps) to several micro seconds (μs). As fabrication process technologies have recently been advanced, such ESD is so strong as to degrade an internal circuit under a situation in which the internal circuit is ultra-small in size. Hence, the importance of an ESD circuit tends to be emphasized.

Meanwhile, an ESD circuit is generally disposed between a pad and an internal circuit, and includes a normal diode, a bipolar junction transistor (BJT), a gate-grounded NMOS (GGNMOS), a gate-coupled NMOS (GCNMOS), and so on.

For reference, a GGNMOS has a structure in which a gate, a source, and a body are coupled to a ground voltage terminal. Due to a breakdown phenomenon, the internal structure of the GGNMOS operates like a BJT to make a large amount of current flow. The GGNMOS is very robust to a relatively long-term ESD, but is weak to protection from ESD introduced into the internal circuit before the actual discharge operation. The GCNMOS has a structure in which a silicide blocking layer is removed. The GCNMOS is very robust to a relatively short-term ESD, but is weak to a relatively long-term ESD. Elements of the ESD circuit are determined depending on the preference reference in the circuit design.

FIG. 1 is a circuit diagram explaining a conventional ESD circuit using normal diodes.

An input/output pad 110, an ESD circuit 120, and an internal circuit 130 are illustrated in FIG. 1.

The ESD circuit 120 protects the internal circuit 130 from ESD introduced through the input/output pad 110. The ESD circuit 120 includes first and second normal diodes D1 and D2 configured to transfer ESD introduced from the input/output pad 110 to a power supply voltage terminal VDD or a ground voltage terminal VSS, and a resistor R configured to drop an ESD voltage.

The sizes of the first and second normal diodes D1 and D2 and the resistor R may vary depending on design, but it is usual to design the first and second diodes D1 and D2 to have a relatively large size. For reference, if the resistor R has a very small resistance, the operation of protecting the internal circuit 130 from the ESD introduced through the input/output pad 110 is degraded. If the resistor R has a very large resistance, data loss may occur during the data input/output operation. Therefore, it is important to design the resistor to have an appropriate size.

Meanwhile, the semiconductor device undergoes a test operation before mass production in order to test whether the internal circuit 130 is protected from ESD introduced through the input/output pad 110 during a normal operation. In the test operation, it is usual to set all nodes to a floating state and apply ESD to only nodes corresponding to ESD intended to be tested.

In other words, when positively charged ESD is applied to the input/output pad 110, the power supply voltage terminal VDD is set to a floating state and a ground voltage is applied to the ground voltage terminal VSS. In this case, the positively charged ESD introduced from the input/output pad 110 is transferred through the first normal diode D1 to the power supply voltage terminal VDD, and then discharged to the ground voltage terminal VSS by a power clamp (not shown). Such a discharge operation is also performed in the normal operation, and the internal circuit 130 is protected from ESD by the above-described operation of the ESD circuit 120.

As the technologies have been advanced, the semiconductor devices have been reduced in size. The size reduction is a factor that can hold a dominant position in price competitiveness. However, the size reduction has reached a limit in recent years. The ESD circuit 120 must include the first and second diodes D1 and D2 and the resistor R in order to protect the internal circuit 130 from ESD, and it is difficult to reduce the sizes of the respective elements.

SUMMARY OF THE INVENTION

An embodiment of the present invention is directed to a semiconductor device in which an internal circuit can replace an existing ESD circuit.

In accordance with an embodiment of the present invention, a semiconductor device includes: an input/output pad; and a data transfer unit configured to form a parasitic diode between the input/output pad and a power supply terminal thereof to discharge an introduced electrostatic discharge (ESD), and form a data transfer path between the input/output pad and an internal circuit in response to a control signal.

In accordance with another embodiment of the present invention, a semiconductor device includes: an input/output pad; a normal MOS transistor configured to form a data transfer path between the input/output pad and an internal circuit in response to a control signal; and a dummy MOS transistor configured to form a parasitic diode between the input/output pad and a power supply terminal thereof to discharge an introduced ESD.

In accordance with yet another embodiment of the present invention, a semiconductor device includes: an input/output pad; first and second normal MOS transistors configured to form a data transfer path between the input/output pad and an internal circuit in response to a control signal; and first and second dummy MOS transistors arranged corresponding to the first and second normal MOS transistors, respectively, and configured to form parasitic diode between the input/output pad and a power supply terminal thereof to discharge positively charged ESD and negatively charged ESD introduced thereto.

DESCRIPTION OF SPECIFIC EMBODIMENTS

Figure 1:
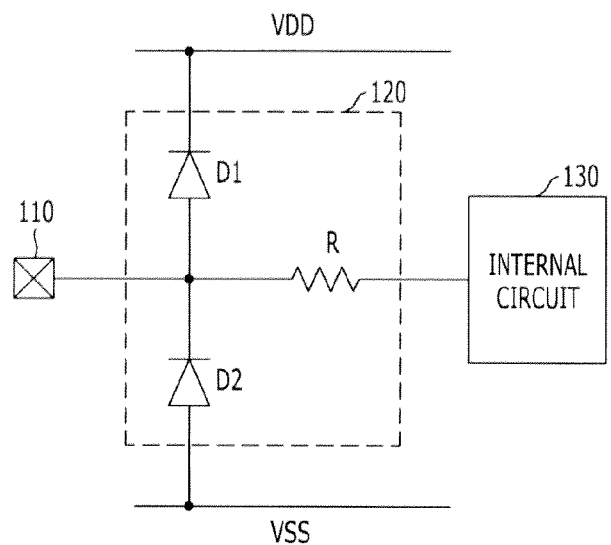
FIG. 1 is a circuit diagram explaining a conventional ESD circuit.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
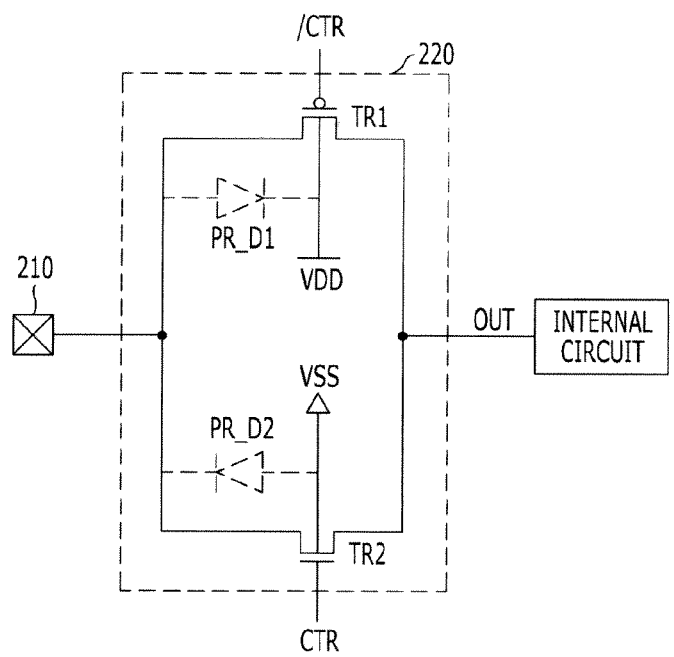
FIG. 2 is a circuit diagram explaining a semiconductor device in accordance with an embodiment of the present invention.

FIG. 2 is a circuit diagram explaining a semiconductor device in accordance with an embodiment of the present invention.

Referring to FIG. 2, the semiconductor device includes an input/output pad 210 and a data transfer unit 220. The data transfer unit 220 is included in an internal circuit.

The input/output pad 210 receives or outputs data during a normal operation, and ESD may be introduced through the input/output pad 210. The data transfer unit 220 forms a data transfer path between the input/output pad 210 and the internal circuit in response to control signals CTR and /CTR during the normal operation. The data transfer unit 220 includes a first MOS transistor TR1 and a second MOS transistor TR2. The first MOS transistor TR1 may be a PMOS transistor which forms a source-drain path in response to the control signal /CTR and has a body coupled to a power supply voltage terminal VDD, and the second MOS transistor TR2 may be an NMOS transistor which forms a source-drain path in response to the control signal CTR and has a body coupled to a ground voltage terminal VSS.

Meanwhile, the data transfer unit 220 in accordance with the embodiment of the present invention can perform a discharge operation with respect to ESD introduced from the input/output pad 210.

As can be seen from FIG. 2, a first parasitic diode PR_D1 is formed between the input/output pad 210 and the body of the first MOS transistor TR1, and a second parasitic diode PR_D2 is formed between the input/output pad 210 and the body of the second MOS transistor TR2. Therefore, it is possible to guarantee the discharge operation with respect to unwanted ESD introduced during a normal operation and artificial ESD introduced during a test operation.

For example, when positively charged ESD is applied to the input/output pad 210 during the test operation, the power supply voltage terminal VDD is set to a floating state and a ground voltage is applied to the ground voltage terminal VSS. In this case, the ESD inputted from the input/output pad 210 is transferred through the first parasitic diode PR_D1 to the power supply voltage terminal VDD, and then discharged to the ground voltage terminal VSS by a power clamp (not shown). This means that the internal circuit can be protected from the ESD. When negatively charged ESD is applied, a discharge operation is performed through the second parasitic diode PR_D2. Consequently, the output signal OUT of the data transfer unit 220 is not affected by the positively charged ESD and the negatively charged ESD.

Figure 3:
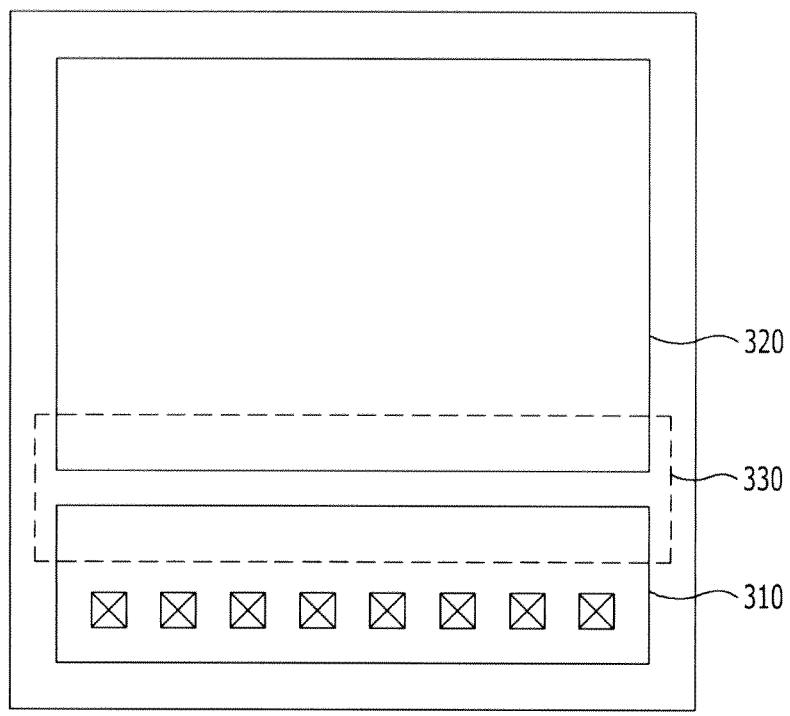
FIG. 3 is a layout diagram explaining a circuit layout of the semiconductor device in accordance with the embodiment of the present invention.

FIG. 3 is a layout diagram explaining a circuit layout of the semiconductor device in accordance with the embodiment of the present invention.

Referring to FIG. 3, the semiconductor device may be divided into a peripheral region 310 and a core region 320. The data transfer unit 220 may be arranged in a region 330 adjacent to the input/output pad 210. Such an arrangement makes it possible for the data transfer unit 220 to protect the input/output pad 210 from ESD. The data transfer unit 220 can perform the discharge operation more efficiently when it is arranged adjacent to the input/output pad 210.

Referring again to FIG. 2, the sizes of the first and second parasitic diodes PR_D1 and PR_D2 may be large in order for a more efficient operation when ESD is introduced. The sizes of the first and second parasitic diodes PR_D1 and PR_D2 may change depending on the design of the first and second MOS transistors TR1 and TR2. Another circuit configuration will be described with reference to FIGS. 4 and 5.

Figure 4:
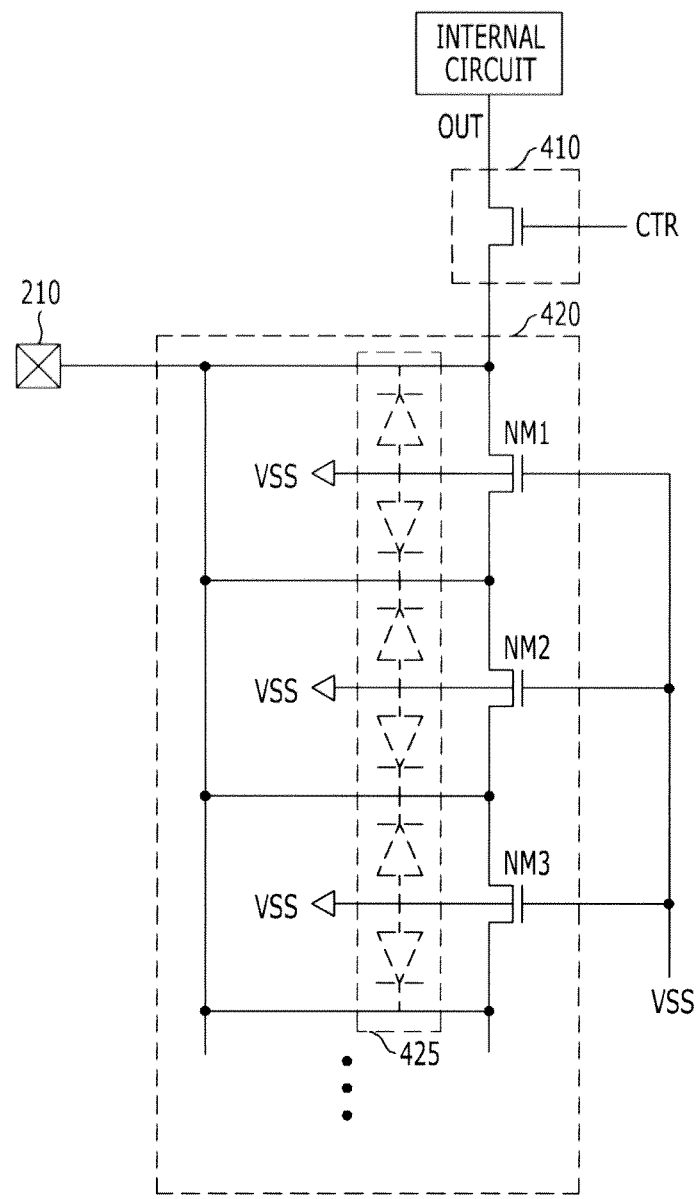
FIG. 4 is a circuit diagram explaining a semiconductor device in accordance with another embodiment of the present invention.

FIG. 4 is a circuit diagram explaining a semiconductor device in accordance with another embodiment of the present invention. For convenience, a circuit configuration corresponding to the second MOS transistor TR2 of FIG. 2 will be described representatively, and the input/output pad 210 and the output signal OUT in FIG. 2 are equally used in FIG. 4.

A normal MOS transistor 410 and a dummy MOS transistor 420 corresponding to the second MOS transistor TR2 of FIG. 2 are illustrated in FIG. 4.

The normal MOS transistor 410 forms a data transfer path between the input/output pad 210 and the internal circuit in response to a control signal CTR, and the output signal OUT of the normal MOS transistor 410 is transferred to the internal circuit.

The dummy MOS transistor 420 forms parasitic diodes between the input/output pad 210 and a ground voltage terminal VSS to thereby discharge ESD introduced from the input/output pad 210. The dummy MOS transistor 420 may be implemented with a plurality of NMOS transistors NM1, NM2 and NM3. In this case, gates of the NMOS transistors NM1, NM2 and NM3 are commonly coupled, and bodies of the NMOS transistors NM1, NM2 and NM3 are coupled to the ground voltage terminal VSS. The commonly coupled gates may be coupled to the ground voltage terminal VSS.

As can be seen from FIG. 4, the parasitic diodes 425 indicated by dotted lines are formed between the bodies of the NMOS transistors NM1, NM2 and NM3 and the input/output pad 210. Therefore, the semiconductor device in accordance with the embodiment of the present invention discharges unwanted ESD introduced during the normal operation and artificial ESD introduced during the test operation by using these parasitic diodes.

As described above, the circuit configuration corresponding to the second MOS transistor TR2 of FIG. 2 is illustrated in FIG. 4. Since the circuit configuration corresponding to the first MOS transistor TR1 is similar to that of FIG. 4, detailed description thereof will be omitted. The parasitic diodes formed in the dummy MOS transistor corresponding to the first MOS transistor TR1 can perform a discharge operation with respect to negatively charged ESD.

For reference, in the case of the normal MOS transistor 410 of FIG. 4, a body is not coupled to the ground voltage terminal VSS. However, it may change depending on design. In a case where the body of the normal MOS transistor 410 is coupled to the ground voltage terminal VSS, the parasitic diodes formed in the dummy MOS transistor 420 are similarly formed in the normal MOS transistor 410. In this case, the MOS transistor and the dummy MOS transistor may have a substantially identical body region. This will serve as a factor that can increase the size of the entire parasitic diodes.

Figure 5:
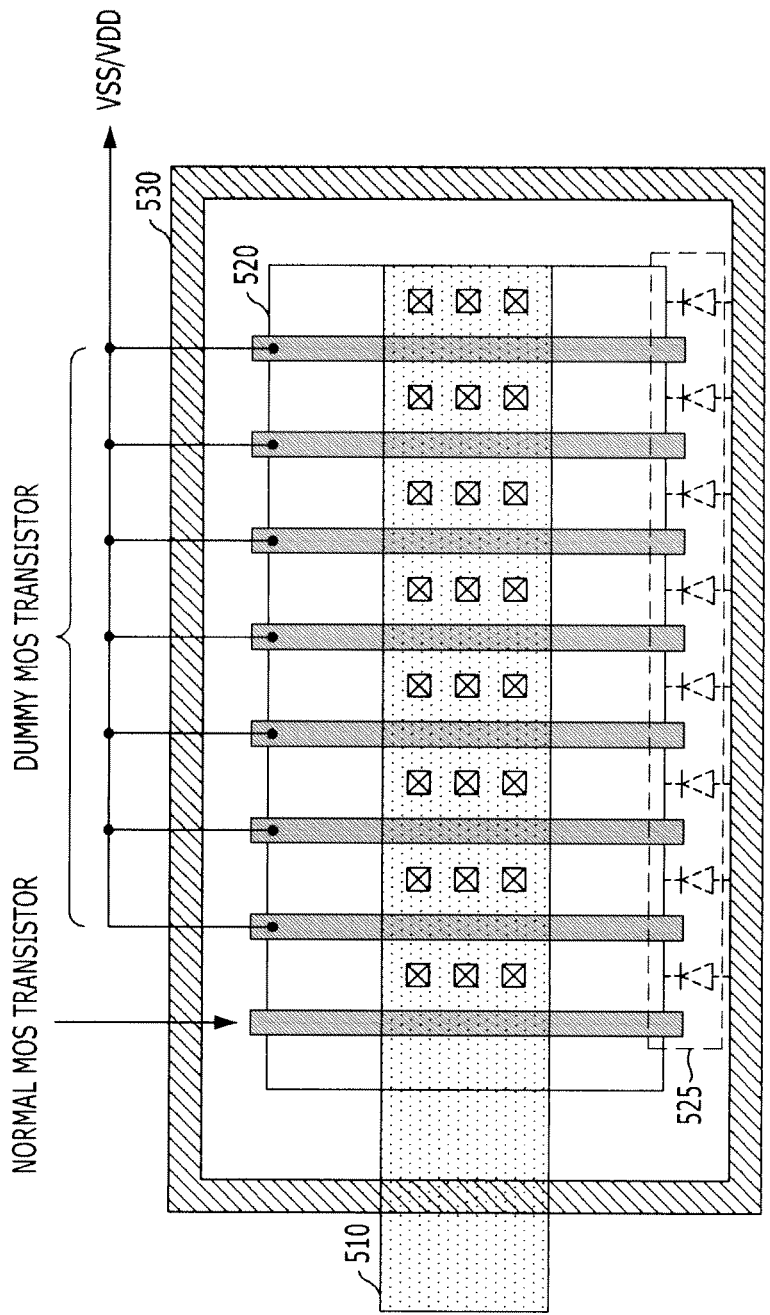
FIG. 5 is a plan view explaining the semiconductor device of FIG. 4 in view of processes.

FIG. 5 is a plan view explaining the circuit of FIG. 4 in view of processes.

The normal MOS transistor and the dummy MOS transistors are illustrated in FIG. 5. The gates of the dummy MOS transistors are commonly coupled, and a region 510 coupled to the input/output pad 210 is contacted with a body region 520. The normal MOS transistor and the dummy MOS transistors have the same body region 520, and a guard ring region 530 surrounds the body region 520. Parasitic diodes 525 indicated by dotted lines are formed between the bodies of the dummy NMOS transistors and the input/output pad. Therefore, the semiconductor device in accordance with the embodiment of the present invention discharges unwanted ESD introduced during the normal operation and artificial ESD introduced during the test operation by using these parasitic diodes.

The semiconductor device in accordance with the embodiment of the present invention can form parasitic diodes (indicated by dotted lines) between the body region 520 and the guard ring region 530. Therefore, the body region 520 and the guard ring region 530 have complementary conductivity types. Furthermore, the body region 520 and the guard ring region 530 may be spaced apart from each other by a predetermined distance.

Meanwhile, the size of the parasitic diode can be increased by increasing the area of the junction region of the normal transistor. However, compared with the case that increases the area of the junction region, the case where the dummy gate is formed on the increased junction region can obtain effects that increase the magnitude of a breakdown voltage of the junction region when ESD is introduced.

As described above, the semiconductor device in accordance with the embodiment of the present invention performs the discharge operation with respect to the ESD by using the internal circuit, instead of the existing ESD circuit, thereby reducing the area occupied by the existing ESD circuit. Furthermore, the size of the data transfer unit for forming the parasitic diodes may be large in order for an efficient operation. To this end, in this embodiment, the dummy MOS transistors are used. When the dummy MOS transistors in accordance with the embodiment of the present invention are applied to a DDI chip, the area benefit can be increased by approximately 30% as compared to the size of the existing ESD circuit.

The area of the semiconductor device can be reduced by using the internal circuit as the ESD circuit. Moreover, the price competitiveness of the semiconductor device can be increased.

While the present invention has been described with respect to the specific embodiments, it will be apparent to those skilled in the art that various changes and modifications may be made without departing from the spirit and scope of the invention as defined in the following claims.

In addition, the positions and types of the logic gates and transistors set forth above may be differently implemented depending on polarities of the input signals.

What is claimed is:

1. A semiconductor device comprising:
    an input/output pad; and
    a data transfer unit, comprising a MOS transistor whose body is coupled to a power supply terminal (VDD) or a ground voltage terminal (VSS), and which forms a data transfer path between the input/output pad and an internal circuit in response to a separate control signal, and a parasitic diode configured between the input/output pad and the power supply terminal (VDD) or the ground voltage terminal (VSS) in parallel with the MOS transistor to discharge incoming electrostatic discharge (ESD).

2. The semiconductor device of claim 1, wherein the MOS transistor forms a source-drain path corresponding to the data transfer path in response to the control signal.

3. The semiconductor device of claim 2, wherein the parasitic diode is formed between the input/output pad and the body of the MOS transistor.

4. The semiconductor device of claim 1, wherein the data transfer unit is arranged in a region adjacent to the input/output pad.

5. The semiconductor device of claim 2, wherein the body region and a guard ring region of the MOS transistor are spaced apart from each other by a predetermined distance.

6. The semiconductor device of claim 5, wherein the body region and the guard ring region have complementary conductivity types.

7. A semiconductor device comprising:
    an input/output pad;
    a normal MOS transistor configured to form a data transfer path between the input/output pad and an internal circuit in response to a control signal; and
    a dummy MOS transistor unit configured to form a parasitic diode between the input/output pad and a power supply terminal thereof to discharge an introduced ESD, wherein the dummy MOS transistor unit comprises at least one dummy MOS transistor.

8. The semiconductor device of claim 7, wherein the normal MOS transistor and the dummy MOS transistor have a substantially identical body region.

9. The semiconductor device of claim 7, wherein the dummy MOS transistor unit comprises a plurality of dummy MOS transistors having gates coupled commonly and bodies coupled to the power supply terminal.

10. The semiconductor device of claim 9, wherein the parasitic diode is formed between the input/output pad and a body of the normal MOS transistor.

11. The semiconductor device of claim 9, wherein the parasitic diode is formed between the input/output pad and the bodies of the dummy MOS transistors.

12. The semiconductor device of claim 7, wherein the normal MOS transistor comprises a MOS transistor configured to form a source-drain path corresponding to the data transfer path in response to the control signal, a body of the MOS transistor being coupled to the power supply terminal.

13. The semiconductor device of claim 12, wherein the parasitic diode is formed between the input/output pad and a body of the normal MOS transistor.

14. The semiconductor device of claim 12, wherein the parasitic diode is formed between the input/output pad and a body of the dummy MOS transistor.

15. The semiconductor device of claim 7, wherein the normal MOS transistor and the dummy MOS transistor unit are arranged in a region adjacent to the input/output pad.

16. The semiconductor device of claim 7, wherein a body region and a guard ring region of the normal MOS transistor and the dummy MOS transistor unit are spaced apart from each other by a predetermined distance.

17. The semiconductor device of claim 16, wherein the body region and the guard ring region have complementary conductivity types.

18. A semiconductor device comprising:
    an input/output pad;

first and second normal MOS transistors configured to form a data transfer path between the input/output pad and an internal circuit in response to a control signal; and first and second dummy MOS transistors arranged corresponding to the first and second normal MOS transistors, respectively, and configured to form a parasitic diode between the input/output pad and a power supply terminal thereof to discharge positively charged ESD and negatively charged ESD introduced thereto.

19. The semiconductor device of claim 18, wherein the first normal MOS transistor and the first dummy MOS transistor have a substantially identical body region, and the second normal MOS transistor and the second dummy MOS transistor have a substantially identical body region.

20. The semiconductor device of claim 18, wherein each of the first and second dummy MOS transistors comprises a plurality of MOS transistors having gates coupled commonly and bodies coupled to the power supply terminal.

21. The semiconductor device of claim 20, wherein the parasitic diode is formed between the input/output pad and the bodies of the MOS transistors.

22. The semiconductor device of claim 18, wherein each of the first and second normal MOS transistors comprises a MOS transistor configured to form a source-drain path corresponding to the data transfer path in response to the control signal, a body of the MOS transistor being coupled to the power supply terminal.

23. The semiconductor device of claim 22, wherein the parasitic diode is formed between the input/output pad and the body of the MOS transistor.

24. The semiconductor device of claim 18, wherein the first and second normal MOS transistors and the first and second dummy MOS transistors are arranged adjacent to the input/output pad.

* * * * *